United States Patent
Chang et al.

[11] Patent Number: 6,087,702
[45] Date of Patent: Jul. 11, 2000

[54] RARE-EARTH SCHOTTKY DIODE STRUCTURE

[75] Inventors: Liann-Be Chang, Tao Yuan Hsien; Hang-Thung Wang, Taipei Hsien, both of Taiwan

[73] Assignee: National Science Council, Taipei, Taiwan

[21] Appl. No.: 09/054,065

[22] Filed: Apr. 2, 1998

[30] Foreign Application Priority Data

Nov. 26, 1997 [TW] Taiwan .................................. 86117807

[51] Int. Cl.$^7$ .......................... H01L 27/095; H01L 29/47; H01L 29/812; H01L 31/07; H01L 31/108
[52] U.S. Cl. .......................... 257/453; 257/471; 257/472; 257/473; 257/485; 257/486; 438/575; 438/580
[58] Field of Search ...................................... 257/471, 472, 257/473, 485, 486, 453; 438/575, 580

[56] References Cited

U.S. PATENT DOCUMENTS

| | | | |
|---|---|---|---|
| 4,394,673 | 7/1983 | Thompson et al. ........................ | 357/15 |
| 5,079,596 | 1/1992 | Smith et al. ................................ | 357/15 |
| 5,323,053 | 6/1994 | Luryi et al. ............................... | 257/485 |
| 5,847,437 | 12/1998 | Chang et al. ............................ | 257/471 |

OTHER PUBLICATIONS

P. Moriarty et al., *Chemical Bonding and Structure of the Sulfur Treated GaAs(111)b Surface*, Apply. Phys. Lett. 67 (3), Jul. 17, 1995, pp. 383–385.

*Primary Examiner*—William Mintel
*Attorney, Agent, or Firm*—Harness, Dickey & Pierce, P.L.C.

[57] ABSTRACT

A method for forming a Schottky diode structure is disclosed. The method includes the steps of: a) Providing a substrate; b) forming a rare-earth containing layer over the substrate; and c) forming a metal layer over the rare-earth containing layer. The Schottky diode structure with a rare-earth containing layer has the properties of high-temperature stability, high Schottky barrier height (SBH), and low reverse leakage current.

4 Claims, 6 Drawing Sheets

RARE-EARTH SCHOTTKY DIODE STRUCTURE

FIELD OF THE INVENTION

The present invention is related to a Schottky diode structure and a manufacturing method thereof, and especially to a Schottky diode structure with the characteristics of high-temperature stability, low reverse leakage current, and high Schottky barrier height (SBH).

BACKGROUND OF THE INVENTION

Up to now, the III–V compounds, such as GaAs, having larger bandgaps than that of Si, are used for fabricating Schottky devices. Such Schottky structures having larger bandgaps and carrier mobilities are often applied in high-speed devices.

In a Schottky device manufacturing process, the Schottky barrier is greatly influenced by the surface state, surface oxidation, and concentration of background impurities. The reverse leakage current is also determined by the factors as mentioned above. Therefore, many researchers has made efforts to solve the above-described problem by developing a manufacturing method or a structure of the Schottky diode with a higher SBH and a low reverse leakage current.

It has been found that the surface state, impurities, and the instability of the semiconductor device (shown in Table 1) would influence the Schottky-barrier height. This is set forth in the article to the Metal Semiconductor Contacts, written by Rhoderick and Williams, and Moriarty's paper (Appl. Phys. Lett. Vol. 67 (3), p383–385 (1995)).

TABLE 1

| | Bond Dissociation Energy $\Delta H^0$ (kcal/mol) |
|---|---|
| Name of Semiconductor | |
| InSb | −7.4 |
| InAs | −13.8 |
| InP | −18 |
| GaAs | −19.5 |
| Name of Oxide | |
| $Pr_2O_3$ | −436 |
| $Al_2O_3$ | −400 |
| $SiO_2$ | −217.6 |
| $In_2O_2$ | −221.3 |
| $Ga_2O_3$ | −258.5 |
| $As_2O_3$ | −156.1 |
| $As_2O_5$ | −218.5 |
| $SbO_2$ | −108.5 |
| $Sb_2O_3$ | −169.4 |

FIG. 1 shows a conventional Schottky diode structure. The conventional manufacturing method is to form a sulfide layer 102 over the substrate 101 by sulfuration and then to form a metal layer 103 over the sulfide layer 102 for increasing the SBH. It is found that the sulfuration can avoid the surface oxidation. However, sulfur has a weak atomic bonding ability with various III—V compounds (as shown in Table 2). Sulfur will evaporate from the surface of the device at a higher temperature such that the surface of the semiconductor device will be oxidized resulting in a reduced SBH.

TABLE 2

| Name of Compound | Bond Dissociation Energy $\Delta H^0$ (kcal/mol) |
|---|---|
| $Pr_3S_4$ | −371.5 |
| $Ag_2S$ | −7.3 |
| InS | −32 |
| $In_2S_3$ | −85 |
| $In_5S_6$ | −185 |
| GaS | −50 |
| $Ga_2S_3$ | −122.8 |
| $Ag_2S$ | −7.3 |
| AuS | no |
| NiS | −22.5 |
| $Ni_2S_3$ | −51.6 |
| $PtS_2$ | −19.86 |

SUMMARY OF THE INVENTION

An object of the present invention is to provide a method for manufacturing a Schottky structure with high-temperature stability, high Schottky barrier height (SBH), and low reverse leakage current.

According to the present invention, the method includes the steps of: a) Providing a substrate; b) forming a rare-earth containing layer over the substrate; and c) forming a metal layer over the rare-earth containing layer.

In accordance with one aspect of the present invention, the rare-earth containing layer is a praseodymium oxide ($Pr_2O_3$) layer.

In accordance with another aspect of the present invention, the praseodymium oxide layer is formed by steps of: b1) Sputtering a praseodymium (Pr) layer over the substrate, and b2) oxidizing the praseodymium layer to the praseodymium oxide layer.

In accordance with another aspect of the present invention, the praseodymium oxide layer has a thickness ranged from 10 Å to 1000 Å.

In accordance with another aspect of the present invention, the rare-earth containing layer is a praseodymium sulfide layer.

In accordance with another aspect of the present invention, the praseodymium sulfide layer is formed by the steps of: b1) Forming a sulfide layer over the substrate, and b2) forming a praseodymium (Pr) layer over the sulfide layer to thus form the praseodymium sulfide layer after the praseodymium (Pr) layer is reacted with the sulfide layer.

In accordance with another aspect of the present invention, in step (b1); the substrate is immersed in a sulfide solution for about 2 to 10 minutes.

In accordance with another aspect of the present invention, the sulfide solution is a mixture of phosphorus pentasulfide ($P_2S_5$) and ammonium sulfide (($NH_4)_2S$) in a ratio ranged from 5 mg/1 ml to 100 mg/1 ml.

In accordance with another aspect of the present invention, in step (b2) the praseodymium (Pr) layer is formed over the sulfide layer by a sputtering process.

In accordance with another aspect of the present invention, the praseodymium layer has a thickness ranged from 10 Å to 1000 Å.

In accordance with another aspect of the present invention, the substrate is a compound selected from a group consisting of GaAs, InGaAs, InGaP, InGaAsP, InP, InAs, and InSb.

In accordance with another aspect of the present invention, the metal layer is an element selected from a group consisting of silver (Ag), gold (Au), platinum (Pt), and palladium (Pd).

In accordance with another aspect of the present invention, the method further includes a step for annealing process after the step (c).

In accordance with another aspect of the present invention, the annealing process is executed at 300° C. for twenty seconds.

In accordance with another aspect of the present invention, the annealing process is executed in the presence of air or nitrogen or under vacuum condition.

Another object of the present invention is to provide a Schottky diode structure with high-temperature stability and low reverse leakage current. The Schottky diode structure includes a substrate, a rare-earth containing layer formed over the substrate, and a metal layer formed over the rare-earth containing layer.

BRIEF DESCRIPTION OF THE DRAWINGS

The present invention may best be understood through the following description with reference to the accompanying drawings, in which.

DETAILED DESCRIPTION OF THE PREFERRED EMBODIMENT

Figure 1:
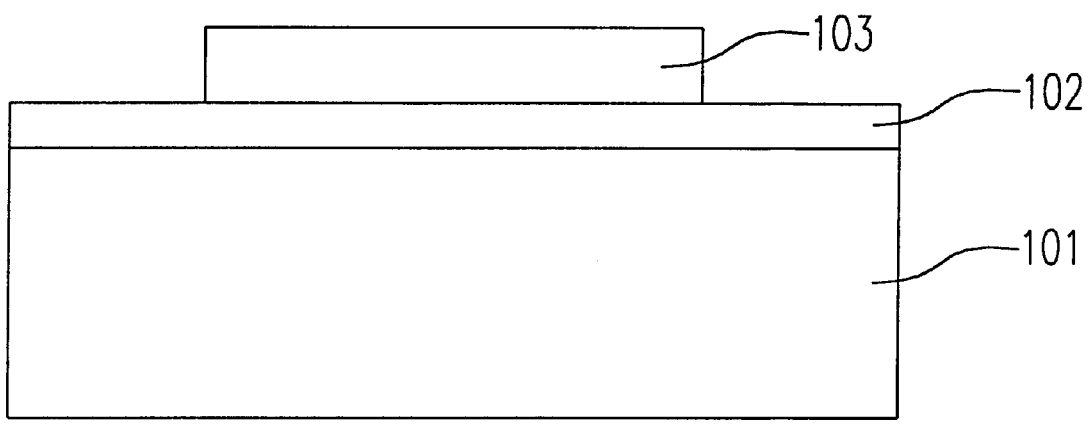
FIG. 1 is a schematic diagram showing a Schottky diode structure of the prior art.
Figure 2A:
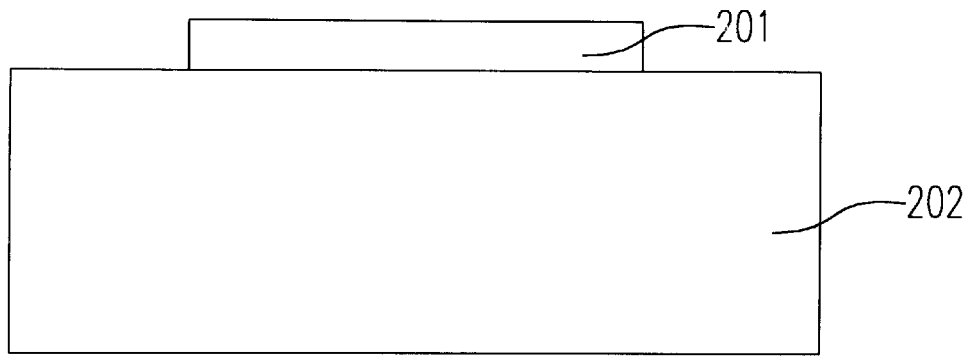
FIGS. 2a and 2b are schematic diagrams showing a first preferred embodiment of a method for forming a Schottky diode structure according to the present invention.

FIG. 2 shows a preferred embodiment of a method for manufacturing a Schottky diode structure of the present invention. As shown in FIG. 2a, a substrate 202 is provided and a praseodymium (Pr) layer 201 is formed over the substrate 202 by a sputtering process, wherein the thickness of the praseodymium (Pr) layer 201 is ranged from 10 Å to 1000 Å. The substrate 202 can be a compound selected from a group consisting of GaAs, InGaAs, InGaP, InGaAsP, InP, InAs, and InSb.

Figure 2B:
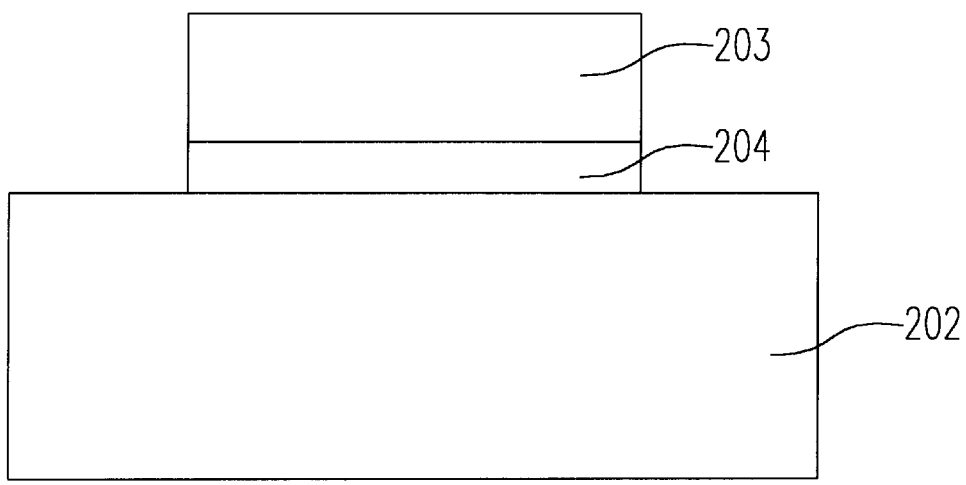

As shown in FIG. 2b, the praseodymium layer 201 is easily oxidized by oxygen to form the praseodymium oxide layer 204 due to its good reducing ability. Thereafter, a metal layer 203 is formed over the praseodymium oxide layer 204 for forming a Schottky diode structure, wherein the metal layer can be made of silver (Ag), gold (Au), platinum (Pt), or palladium (Pd).

Figure 3A:
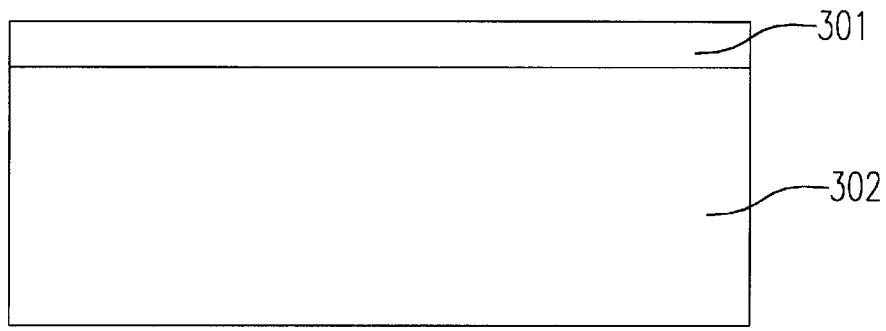
FIGS. 3a~3c are schematic diagrams showing a second preferred embodiment of a method for forming a Schottky diode structure according to the present invention.

Another preferred embodiment of the present invention is shown in FIG. 3. The substrate 202 is immersed in a sulfide solution for about 2–10 minutes and is dried by nitrogen gas. The sulfide solution is a mixture of phosphorus pentasulfide ($P_2S_5$) and ammonium sulfide (($NH_4$)$_2$S) in a ratio ranging from 5 mg/1 ml to 100 mg/1 ml. Thereafter, a sulfide layer 301 is formed over the substrate as shown in FIG. 3a.

Figure 3B:
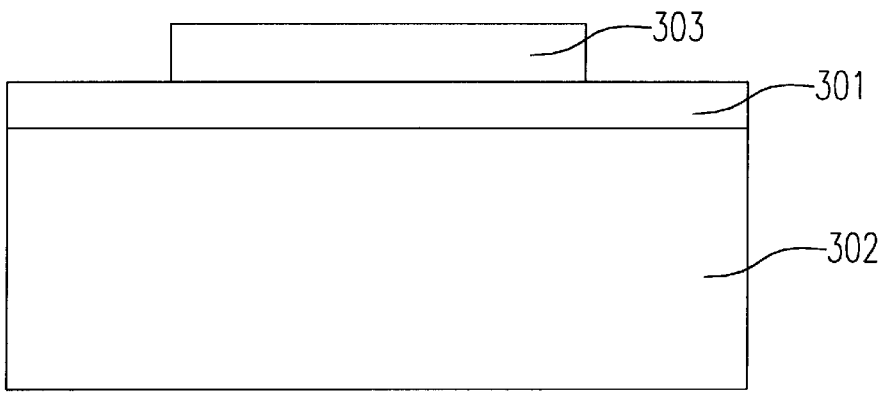
Figure 3C:
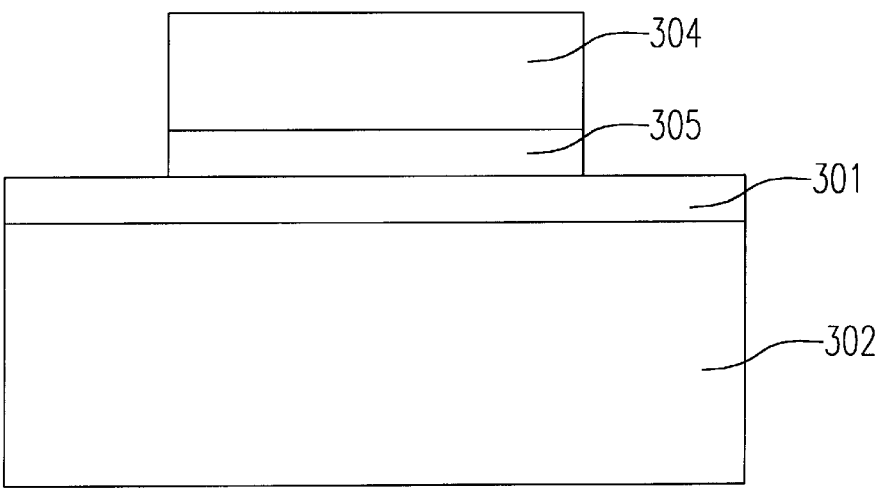

In FIG. 3b, a praseodymium (Pr) layer 303 is formed over the sulfide layer 301 by the sputtering process to thus form the praseodymium sulfide layer 305 after the praseodymium (Pr) layer 303 is reacted with the sulfide layer 301, wherein the thickness of the praseodymium (Pr) layer 303 ranges from 10 Å to 1000 Å. Then, a metal layer 304 is formed over the praseodymium sulfide layer 305 for forming a Schottky diode structure, wherein the metal layer 304 is made of silver (Ag), gold (Au), platinum (Pt), or palladium (Pd) as shown in FIG. 3c.

According to the present invention, the method further includes a step for an annealing process executed at 300° C. for twenty seconds. The annealing process is operated in the presence of air or nitrogen or under vacuum condition.

Both of the Schottky diode structures formed accordingly are tested in order to analyze the characteristics of current-voltage (I–V) and capacity-voltage (C–V). The Schottky diode structure with the praseodymium sulfide layer of the second embodiment is numbered by # S 01 and the Schottky diode structure with the praseodymium oxide layer of the first embodiment is numbered by # S 02. The control is a conventional Schottky diode structure which is only processed by sulfuration without sputtering praseodymium. All of them are baked at 300° C. for eight hours and are then analyzed for the measurements of current-voltage (I–V) and capacity-voltage (C–V). All results are shown in Table 3.

Figure 4:
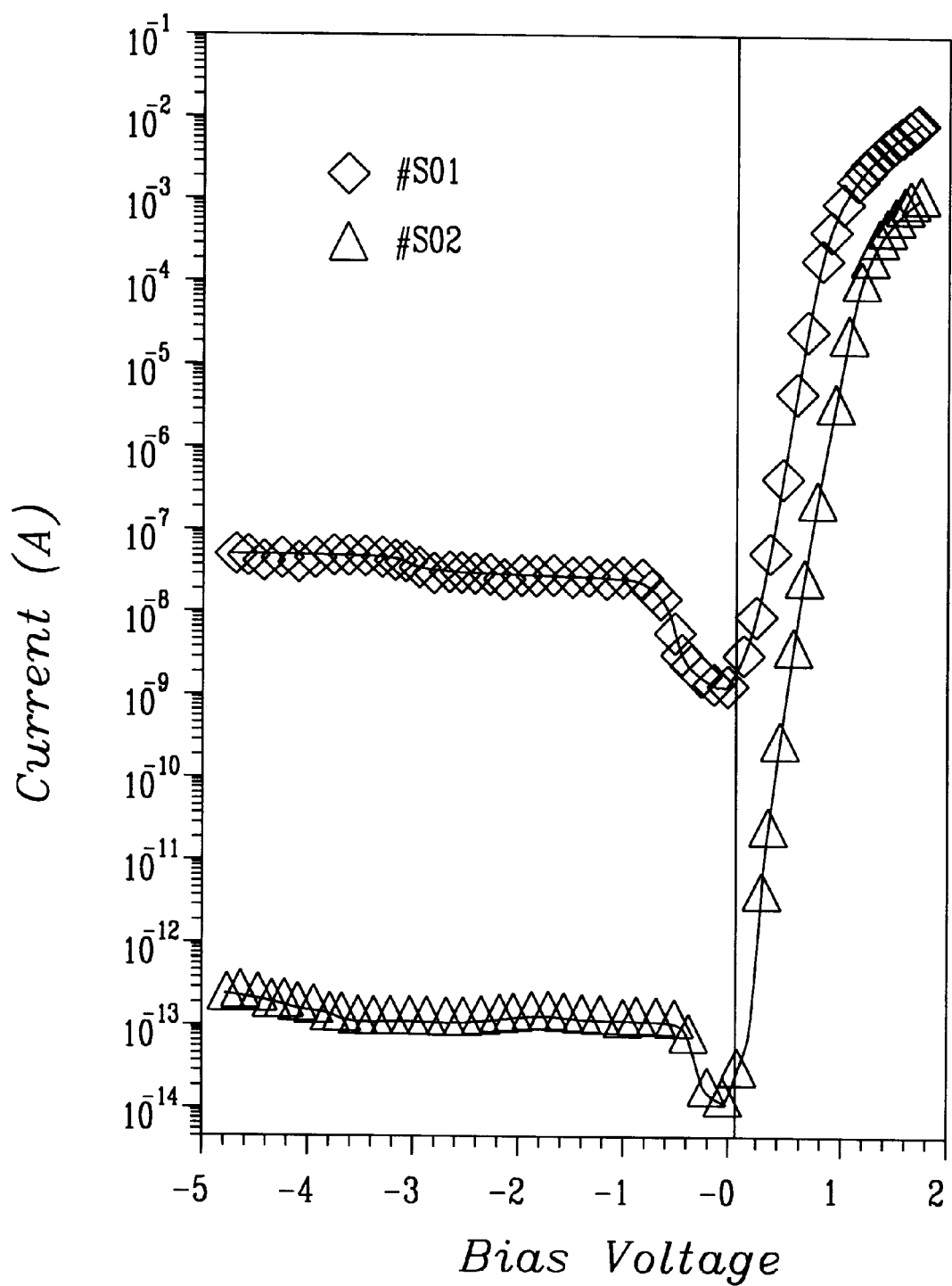
FIG. 4 is a comparison of the current-voltage measurement between the first Schottky diode structure formed by the method of FIG. 2 and the second Schottky diode structure formed by the method of FIG. 3.

FIG. 4 is a comparison of the current-voltage measurement between # S 01 and # S 02. The Schottky barrier $\phi b_{I-V}$ of # S 01 is 0.76 ev, but the Schottky barrier $\phi b_{I-V}$ of # S 01 is 1.05 ev.

Figure 5:
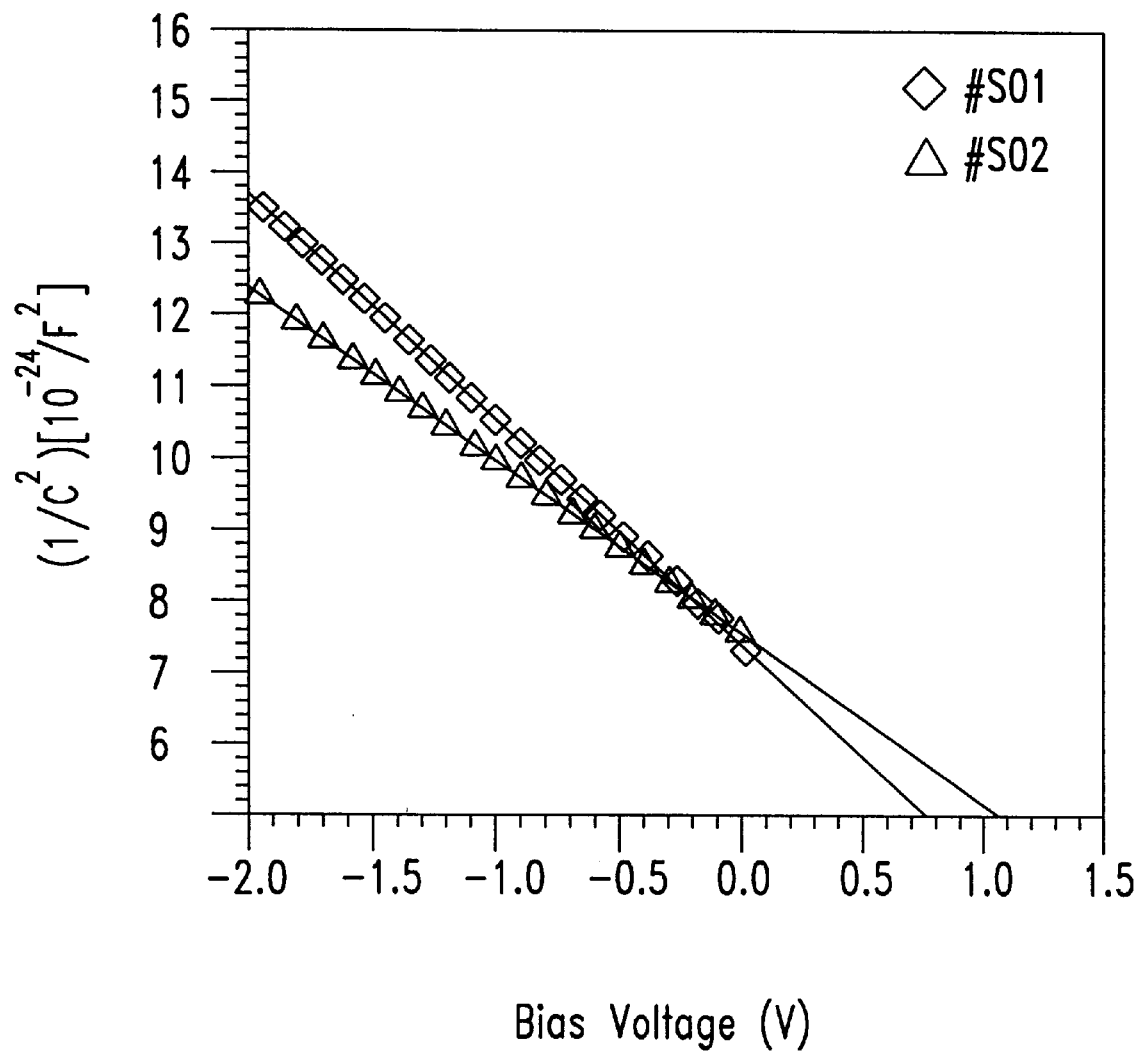
FIG. 5 is a comparison of the capacity-voltage measurement between the first and second Schottky diode structures.

FIG. 5 is a comparison of the capacity-voltage measurement between # S 01 and # S 02. The Schottky barrier $\phi b_{C-V}$ of # S 01 is 0.77 ev, but the Schottky barrier $\phi b_{C-V}$ of # S 01 is 1.07 ev.

TABLE 3

| Test after baked at 300° C. for 8 hours | Measure results of current-voltage | | Measure results of capacity-voltage | |
|---|---|---|---|---|
| | the ideality factor (n) | $\Phi b_{I-V}$ | $\Phi b_{C-V}$ | $N_d$ (cm$^{-3}$) |
| Control | 1.03 ± 0.02 | 0.41 | 0.43 | 2.17 × 10$^{15}$ |
| # S 01 | 1.12 ± 0.02 | 0.75 ± 0.01 | 0.77 ± 0.02 | 3.14 × 10$^{15}$ |
| # S 02 | 1.35 ± 0.02 | 1.05 ± 0.01 | 1.07 ± 0.01 | 4.31 ± 10$^{15}$ |

Figure 6:
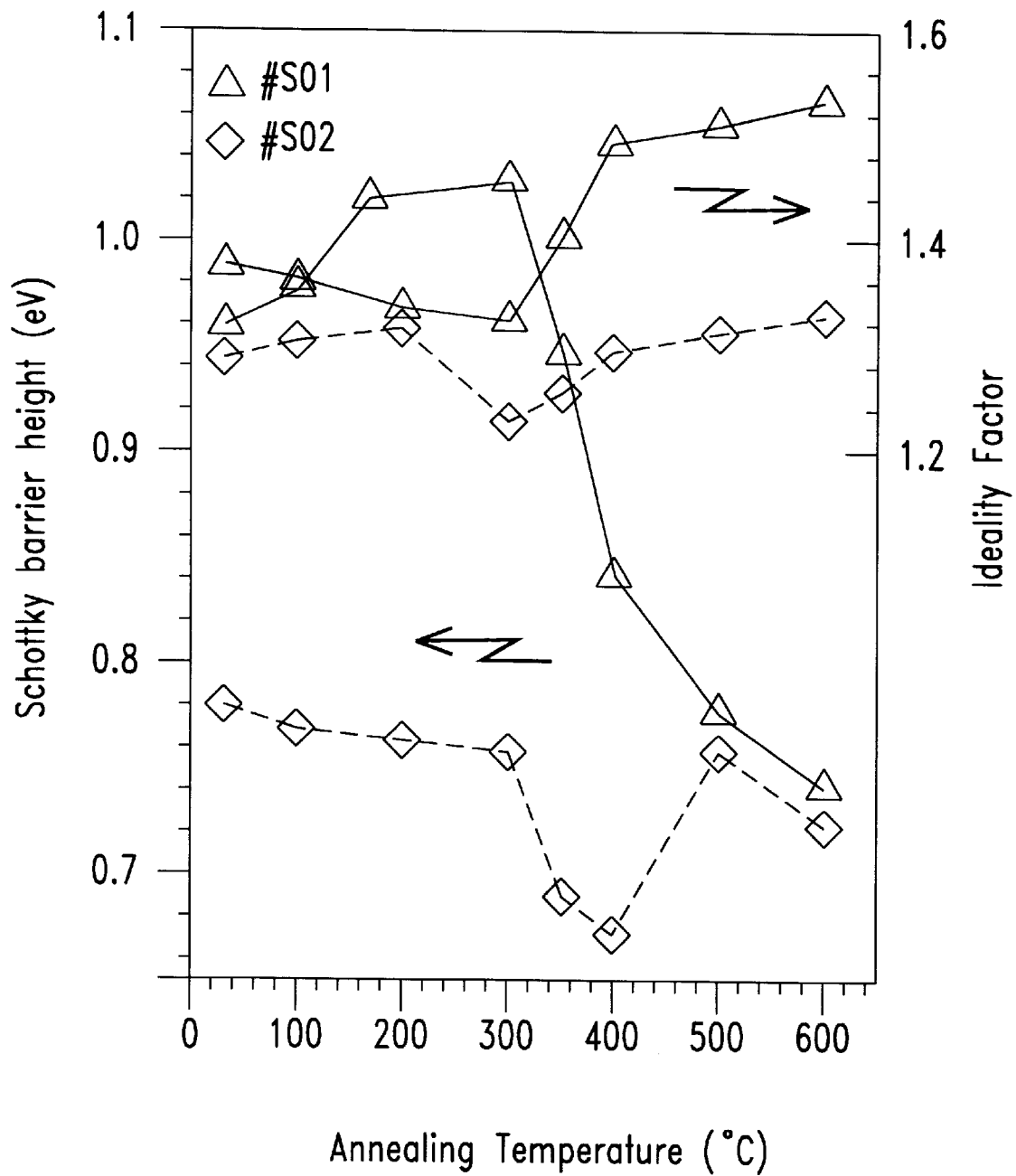
FIG. 6 is an illustration showing a relation of annealing temperature and the ideality factor for the first and second Schottky diodes respectively.

FIG. 6 illustrates relations of various annealing temperatures and the ideality factors for # S 01 and # S 02. The ideality factor of # S 0 1 is 1.12 and its leakage current at the bias voltage of −3 V is 6.2×10$^{-5}$ A/cm$^2$, but the ideality factor of # S 01 is 1.35 and its leakage current at the bias voltage of −3 V is 1.86×10$^{-10}$ A/cm$^2$.

From the above data, it is clearly indicated that the stability of the conventional Schottky diode structure varies along with variations in temperatures although it is processed by sulfuration to prevent the surface of the device from being oxidized. On the contrary, the Schottky diode structures with the praseodymium sulfide layer according to the present invention demonstrate stable surface states and higher Schottky barriers by taking advantage of strong bonding ability between praseodymium and sulfur as well as the anti-oxidation property of praseodymium sulfide. In addition, praseodymium is easily oxidized by oxygen to form praseodymium oxide which has a vigorous resistance to high temperature. Thus, the Schottky diode structures with the praseodymium oxide layer of the present invention have the most stable surface states and can increase the Schottky barrier height.

In conclusion, the Schottky diode structure with a rare-earth containing layer according to the present invention has the characteristics of high-temperature stability (>300° C.), high SBH, and low reverse leakage current. Moreover, the present invention provides a simple process for forming the Schottky diode structure to meet the requirement of the gate of high-speed devices, for example, optoelectronical field effect transistor (OPFET), metal-semiconductor field effect transistor (MESFET), and metal/semiconductor/metal field effect transistor (MSMFET). The method of the present invention is quite suitable for mass production.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded the broadest interpretation so as to encompass all such modifications and similar structures.

What is claimed is:

1. A Schottky diode structure comprising:

a substrate;

a rare-earth containing layer formed over said substrate wherein said rare-earth containing layer is one selected from the group consisting of a rare-earth oxide layer and a rare-earth sulfide layer; and a metal layer formed over said rare-earth containing layer.

2. A structure according to claim 1 wherein said substrate is made of one selected from a group consisting of GaAs, InGaAs, InGaP, InGaAsP, InP, InAs, and InSb.

3. A structure according to claim 1 wherein said rare-earth containing layer is a praseodymium oxide layer ($Pr_2O_3$).

4. A structure according to claim 1 wherein said rare-earth containing layer is a praseodymium sulfide layer.

* * * * *